United States Patent
Boettcher et al.

(10) Patent No.: US 6,639,314 B2
(45) Date of Patent: Oct. 28, 2003

(54) SOLDER BUMP STRUCTURE AND A METHOD OF FORMING THE SAME

(75) Inventors: Mathias Boettcher, Dresden (DE); Gisela Schammler, Dresden (DE); Frank Kuechenmeister, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/132,123

(22) Filed: Apr. 25, 2002

(65) Prior Publication Data

US 2003/0052415 A1 Mar. 20, 2003

(30) Foreign Application Priority Data

Sep. 20, 2001 (DE) .......................... 101 46 353

(51) Int. Cl.[7] .................. H01L 23/48; H01L 23/52; H01L 29/40
(52) U.S. Cl. ............... 257/736; 257/737; 257/738; 438/612; 438/613; 438/614; 438/627; 438/643; 438/653
(58) Field of Search ................ 438/612, 613, 438/614, 627, 643, 653; 257/737, 736, 738

(56) References Cited

U.S. PATENT DOCUMENTS 4,742,023 A * 5/1988 Hasegawa .................. 437/183
5,937,320 A 8/1999 Andricacos et al. ........ 438/614
6,440,836 B1 * 8/2002 Lu et al. ..................... 438/612

FOREIGN PATENT DOCUMENTS

| EP | 0 261 799 A1 | 8/1987 | ........... H01L/23/43 |
| JP | 03295243 A | 12/1981 | ......... H01L/21/321 |
| JP | 04312924 A | 11/1992 | ......... H01L/21/321 |
| JP | 08045941 A | 2/1996 | ......... H01L/21/321 |
| JP | 08213401 A * | 8/1996 | ......... H01L/21/321 |
| JP | 1029154 A * | 8/1998 | ....... H01L/21/3205 |
| JP | 10209154 A | 8/1998 | ......... H01L/21/321 |

* cited by examiner

*Primary Examiner*—William David Coleman
*Assistant Examiner*—Hsien Ming Lee
(74) *Attorney, Agent, or Firm*—Williams, Morgan & Amerson, P.C.

(57) ABSTRACT

A solder bump structure and a method for forming the same are disclosed. Over a contact pad a first and a second metal film are deposited, wherein the second metal film is patterned prior to the deposition of a solder bump material such that an opening isolates an inner region of the second metal film from an outer region of the second metal film. The solder material deposited on the inner region and, at least partially, in the opening serves as an etch stop for a subsequent removal of the outer region.

25 Claims, 5 Drawing Sheets

SOLDER BUMP STRUCTURE AND A METHOD OF FORMING THE SAME

BACKGROUND OF THE INVENTION

1. Field of the Invention

The present invention relates to the field of fabrication of interconnections in integrated circuits, particularly to a solder bump structure used to provide electrical contact between a semiconductor chip and the environment, and it also relates to a method of forming a solder bump structure.

2. Description of the Related Art

The need for high-performance semiconductor chips has continually increased over the past several years, while at the same time the functionality of the circuitry has become more complex and the amount of area per chip has decreased. In general, an increase in functionality requires the provision of a large number of single electronic devices that need to be electrically interconnected to form a plurality of functional units. In order to output signals to, and receive signals from, an external source, an appropriate interface between the chip and the external source is necessary which provides the input/output (I/O) capability required. Modern integrated circuits (ICs), such as CPUs, must therefore include a large number of contact pads or bond pads on the chip to establish an electrical connection to peripheral devices via an appropriately formed chip package. Thus, one major aspect in fabricating ICs is the formation of efficient and reliable interconnections, both electrically and mechanically, between the contact pads and the package.

One technique widely used for making interconnections between the chip and the package is wire bonding. According to this bonding technique, flexible wires are attached one at a time from the bond pads on top of the chips to the leads of the package. The materials used for wire bonding are typically gold or aluminum since these materials are highly conductive and adhere well to the metallization formed on both the chip and the package.

The employment of flexible wires, however, imposes certain constraints on the applicability of wire bonding. One of these limitations resides in the fact that the length of a single wire is restricted from about 1–4 mm to minimize the risk for shorts at adjacent wires, as longer wires are likely to droop or to be deformed. Thus, the location of the bond pads is substantially restricted to the chip perimeter. Consequently, a high I/O capability requires a large chip area, which renders wire bonding a less attractive bonding technique for modem, highly complex ICs. A further drawback of wire bonding is that even after a wire bond is formed on the aluminum bond pad, a fairly large area of the pad remains exposed and allows any material to react with the aluminum, as aluminum is a chemically reactive material which readily reacts even with pure water.

According to another bonding technique, referred to as tape automated bonding (TAB), bond bumps are formed at the periphery of the chip and are then bonded to a wiring arrangement formed on a flexible tape. The wiring pattern formed in the tape replaces the flexible wires used in wire bonding and thus eliminates some of the drawbacks of wire bonding.

According to a further technique, i.e., the so-called flip chip technology, solder bumps are formed on contact pads provided at respective locations across the entire chip surface. After reflowing the solder bumps to create solder balls, these solder balls are brought into contact with and aligned to a package, a print board, and the like, which comprise a pad arrangement that is a mirror image of the chip pad arrangement. Subsequently, the chip and package are attached to each other by reflowing the solder balls so as to establish an electrically and mechanically reliable connection.

With reference to FIGS. 1a–1f, a typical prior art process for forming solder bumps according to the flip chip technology will be briefly described. FIGS. 1a–1f show schematic cross-sectional views of a semiconductor structure at various manufacturing stages representative for the formation of solder bumps.

As shown in FIG. 1a, a substrate 1, such as a silicon substrate or any other substrate appropriate for semiconductor or IC technology, is provided and may include various layers and structures defining active and passive semiconductor regions. Leads (not shown) in the form of doped areas or buried layers in the substrate 1 are connected to a contact pad 4 substantially consisting of aluminum and formed in a passivation layer including a silicon dioxide layer 2 and a polyimide layer 3. The passivation layer 2, 3 covers the edges of the contact pad 4. Patterning of the passivation layer 2, 3 is performed by lithographical techniques that are well known in the art.

As shown in FIG. 1b, a multilayer metal film 5, for example including a titanium/tungsten (TiW) layer, a chromium/copper (Cr/Cu) layer and a copper layer, is formed on the passivation layer 2, 3 and the contact pad 4 by, for instance, sputter deposition.

As depicted in FIG. 1c, in a further advanced manufacturing stage, the substrate 1 further comprises a photoresist mask 6 having an opening 7 above the contact pad 4.

Referring to FIG. 1d, in a next manufacturing stage, the substrate 1 comprises a solder bump 8 including, for example, lead (Pb) and tin (Sn) that is formed in the opening 7.

According to a typical prior art process, the structure depicted in FIG. 1d may be formed in conformity with the following process flow. After patterning the photoresist mask 6, the substrate 1 is inserted in a plating bath including lead (Pb) and tin (Sn) containing sulfates. The edge region of the substrate 1 is connected to one of two electrodes, whereas the other electrode is located in the bath in the vicinity of the substrate 1. After applying a voltage across the electrodes, e.g., a DC voltage or a pulsed DC voltage, a current flow is generated from the substrate perimeter to the opening 7 via the multilayer metal film 5, thereby reducing lead (Pb) and tin (Sn) ions which are then deposited at the bottom of the opening 7 to gradually form the solder bump 8. To create a large number of solder bumps 8 exhibiting a satisfactorily identical structure, the multilayer metal film 5, acting as a current distribution layer, needs to be uniformly deposited on the substrate 1 to supply substantially the same amount of current to each opening 7.

FIG. 1e shows the substrate 1 with the photoresist mask 6 removed.

FIG. 1f shows the substrate 1 in a further advanced manufacturing stage, wherein the multilayer metal film 5 is partially removed to electrically insulate the solder bump 8 from the remaining substrate surface. The multilayer metal film 5 may be removed by etching each of the layers constituting the multilayer metal film 5, wherein the solder bump 8 serves as an etch mask for that portion of the multilayer metal film 5 that is located below the solder bump 8. This portion, also sometimes referred to as under-bump metallization, serves as an adhesion layer and a diffusion barrier to avoid diffusion of the lead (Pb) and tin (Sn) atoms into the underlying layers while ensuring a sufficient mechanical adhesion of the solder bump 8 to the remaining contact pad 4. During this etch process, the solder bump 8 may be underetched up to approximately 10 µm depending on the type of etch process, the dimensions of the solder bump 8, and the thickness of the individual sublayers of the metal film 5. As a consequence, edge regions 10 and 11 of the contact pad 4 may be exposed and oxidized, resulting in a deteriorated performance of the completed bond contact. Furthermore, since the removal of the multilayer metal film 5 requires a highly complex etch process, such an underetch depends on a variety of parameters that are mostly undefined, so that the area covered by the multilayer metal film 5 may vary in accordance with unavoidable variations of the parameters. Therefore, the size of a solder ball formed by reflowing the solder bump 8 may also vary since the solder of the bump 8 usually recedes onto the metal film 5, i.e., the under-bump metallization, during reflowing the solder due to surface tension of the liquid solder material.

Especially in applications necessitating a large number of interconnects, it is extremely important to provide substantially equally formed solder balls, and thus solder bumps, to ensure a reliable connection of each individual solder ball with its respective counterpart on the package, as already the failure of a single solder bond may lead to a complete failure of the entire IC.

Accordingly, the present invention is directed to a bump structure and a method allowing the fabrication of bumps with well-defined dimensions.

SUMMARY OF THE INVENTION

According to one embodiment of the present invention, a method of forming a solder bump comprises providing a substrate having formed thereon a contact pad and a passivation layer covering the perimeter of the contact pad. Moreover, a first metal film is deposited on the substrate and a second metal film is deposited on the first metal film. Additionally, the second metal film is patterned to form an opening, wherein the opening isolates an inner region of the second metal film from an outer region of the second metal film, whereby the inner region covers the contact pad. Furthermore, the method comprises depositing a metal in the inner region and in the opening.

According to a another embodiment of the present invention, a solder bump structure comprises a substrate having formed thereon a contact pad formed in a passivation layer, a first metal film formed on the substrate and the contact pad, and a second metal film formed on the first metal film, wherein the second metal film has an inner region above the contact pad and an outer region separated from the inner region by an opening formed in the second metal film around the contact pad. The solder bump structure further comprises a solder formed on the inner region of the second metal film and at least partially formed in the opening.

BRIEF DESCRIPTION OF THE DRAWINGS

The invention may be understood by reference to the following description taken in conjunction with the accompanying drawings, in which like reference numerals identify like elements, and in which.

Figure 1A:
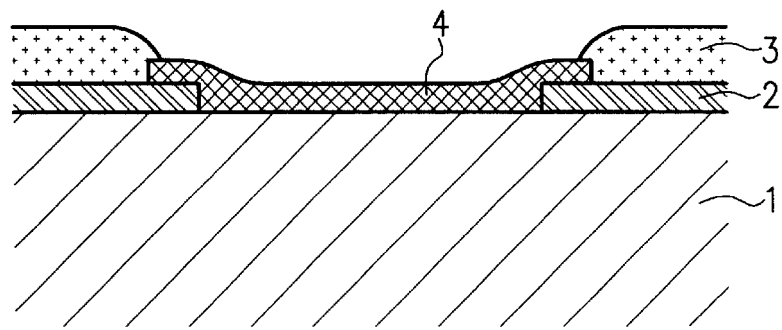
FIG. 1a depicts a substrate having a contact pad formed thereabove in accordance with an illustrative prior art technique.
Figure 1B:
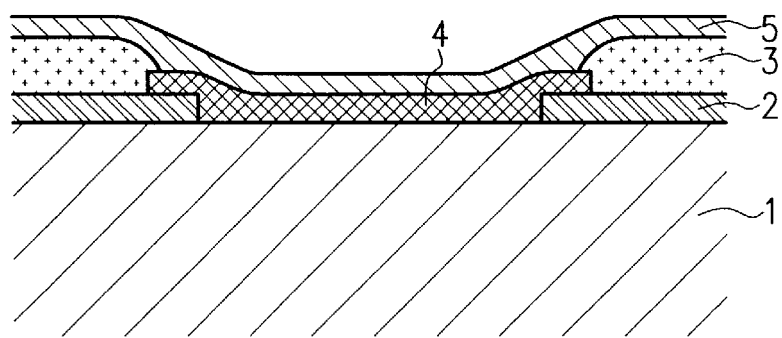
FIG. 1b depicts the structure of FIG. 1a after a multilayer film has been formed thereabove.
Figure 1C:
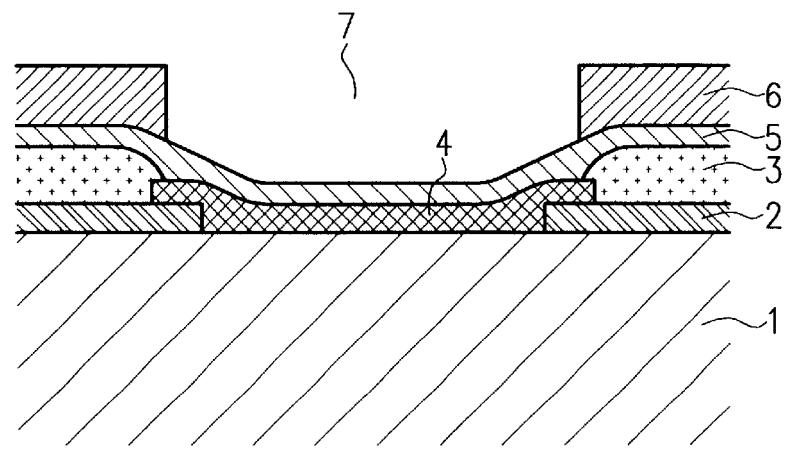
FIG. 1c depicts the structure of FIG. 1b after a photomask has been formed above the multilayer metal film.
Figure 1D:
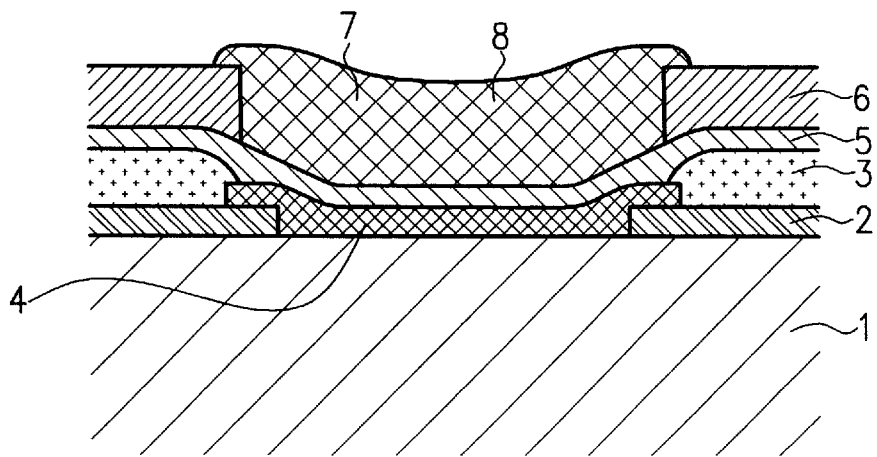
FIG. 1d depicts the structure of FIG. 1c after a solder bump has been formed above the multilayer film in the opening in the photomask.
Figure 1E:
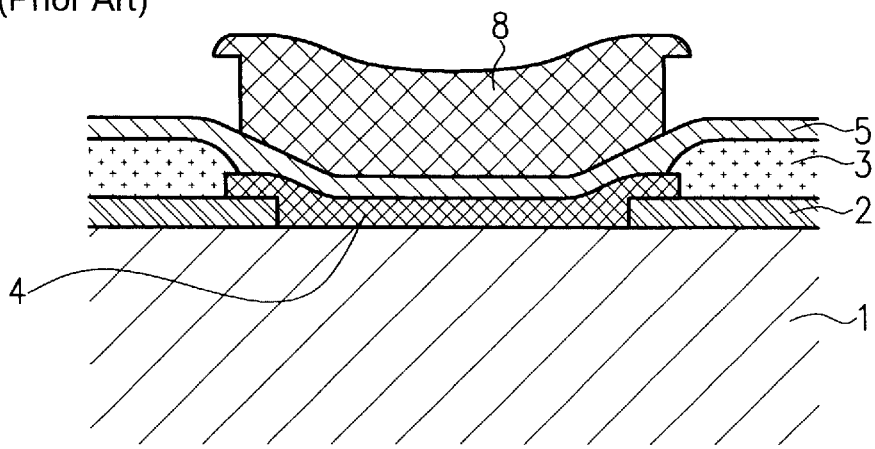
FIG. 1e depicts the structure of FIG. 1d after the photomask has been removed.
Figure 1F:
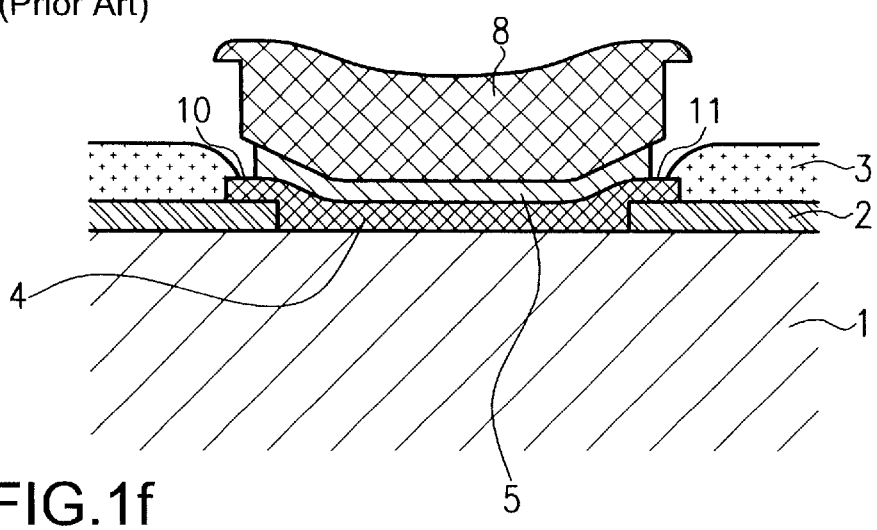
FIG. 1f depicts the structure of FIG. 1e after the multilayer film has been removed by performing an etching process wherein the solder bump serves as an etch mask in accordance with one illustrative prior art technique.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

With reference to FIGS. 2a–2i, illustrative embodiments according to the present invention will now be described. In FIGS. 2a–2i the same reference numerals as in FIGS. 1a–1f are used to indicate similar or equal components and parts. FIGS. 2a–2i show schematic cross-sectional views of a semiconductor substrate bearing a solder bump structure at various manufacturing stages in accordance with the present invention.

Figure 2A:
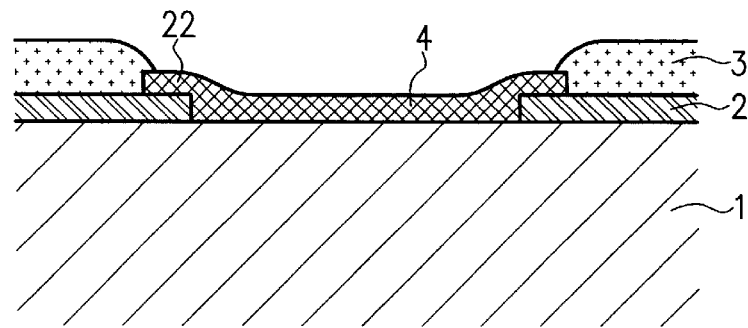
FIG. 2a depicts a substrate having a contact pad formed thereabove.

FIG. 2a shows a substrate I that may include a plurality of individual semiconductor devices, such as field effect transistors, which are in turn electrically connected via one or more metallization layers (not shown) to a contact pad 4 substantially comprised of an electrically conductive material such as aluminum. The contact pad 4 is formed in a passivation layer, for example comprised of a silicon dioxide layer 2 and a polyimide layer 3. As depicted in FIG. 2a, an edge portion 22 of the contact pad 4 may cover the silicon dioxide layer 2 and may in turn be covered by the polyimide layer 3. It should be noted that any other suitable insulating material may be used for the passivation layer 2, 3, such as silicon nitride, glass, and the like. The passivation layer 2, 3 may be thermally grown on the substrate 1, deposited by a chemical or a physical vapor deposition, or by spin coating.

Figure 2B:
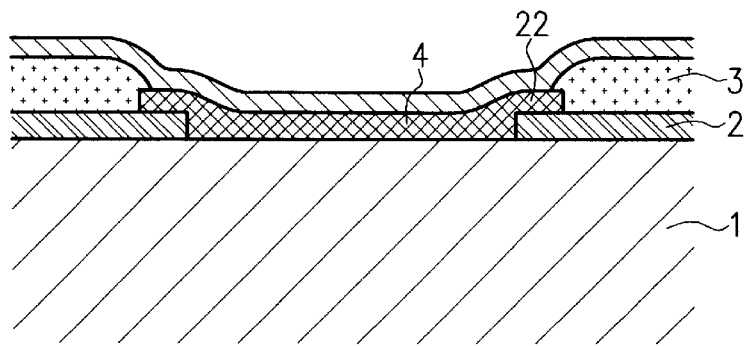
FIG. 2b depicts the structure of FIG. 2a after a first metal film is formed thereabove.

Referring to FIG. 2b, a first metal film 5 is formed over the contact pad 4 and the polyimide layer 3. The first metal film 5 may comprise metals or materials with metallic properties, such as titanium/tungsten (TiW), chromium, copper, chromium/copper, copper/tin, gold, and the like. As previously explained, the first metal film 5 may serve as a diffusion barrier layer preventing diffusion of metal atoms or other particles from layers above the first metal film 5 into regions underlying the first metal film 5 and vice versa. Moreover, the first metal film 5 may provide a required adhesion to overlying and underlying layers to ensure sufficient mechanical stability. The first metal film 5 may be deposited by sputter deposition or chemical vapor deposition and the like.

Figure 2C:
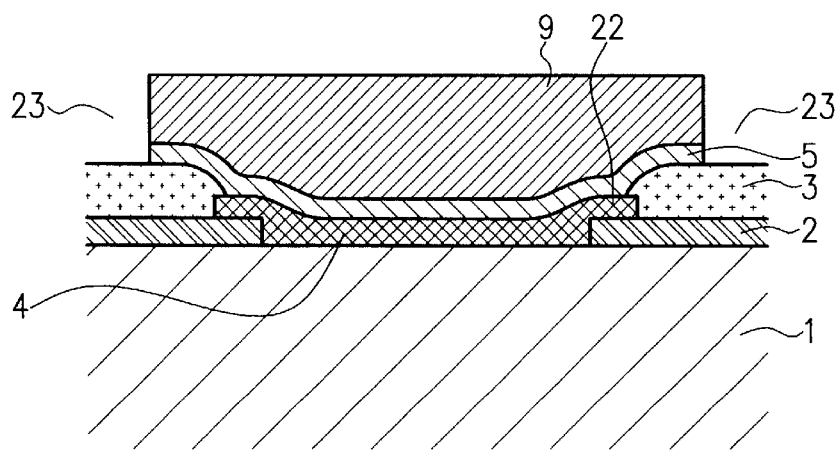
FIG. 2c depicts the structure of FIG. 2b after a photomask has been formed above the first metal film and an etching process has been performed to pattern the first metal film into an island in accordance with one illustrative embodiment of the present invention.

In FIG. 2c, a photoresist mask 9 is formed on top of the first metal film 5. The photoresist mask 9 is formed by well-known photolithographic techniques and is used to pattern the first metal film 5 into an island, herein below denoted by the same reference numeral as the first metal film 5, to thereby create an uncovered region 23. In a further embodiment, the island of the first metal film 5 is formed by metal deposition through an appropriately formed mask (not shown) that is brought into contact with the substrate 1. In this way, deposition and patterning of the first metal film 5 be carried out in a single step.

Figure 2D:
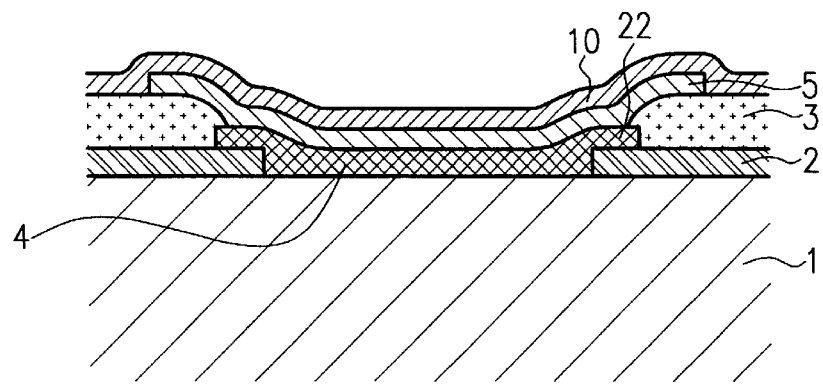
FIG. 2d depicts the structure of FIG. 2c after the photomask has been removed and a second metal film is formed above the patterned first metal film in accordance with one illustrative embodiment of the present invention.

In FIG. 2d, according to one illustrative embodiment (not shown), the substrate 1 comprises a second metal film 10 formed on the entire surface of the substrate 1 including the island of the first metal film 5.

According to a further illustrative embodiment, the first metal film 5 is not patterned and the second metal film 10 is deposited on the first metal film 5, similarly to the conventional process flow described in the introductory part of the application.

Similarly, as the first metal film 5, the second metal film 10, may comprise a plurality of sub-layers comprising electrically conductive materials such as titanium/tungsten, chromium, copper, chromium/copper, copper/tin, gold or any combination thereof. The second metal film 10 acts as an adhesion layer between the first metal film 5 and a solder material to be deposited on the second metal film 10. Furthermore, the second metal film 10 may serve as a diffusion barrier to enhance the overall effect of the first metal film 5 and the second metal film 10 in preventing diffusion of metal atoms into the substrate 1.

As previously explained, the second metal film 10, possibly in combination with the first metal film 5 when the embodiment including an unpatterned first metal film 5 is considered, will serve as a current distribution layer for a subsequent electroplating process for depositing a solder material, and hence the second metal film 10 and the first metal film 5, when considering the embodiment with an un-patterned first metal film 5, are to be deposited as uniformly as possible to supply substantially the same amount of current to the area above the contact pad 4 for each contact pad 4 formed on the substrate. Thus, for large area substrates 1, such as wafers used in process lines of modern semiconductor facilities, preferably the second metal film 10 and the first metal film 5 are deposited by sputter deposition so as to yield a uniform layer thickness across the entire substrate surface. According to further illustrative embodiments, in particular when smaller substrates are used, the second metal film 10 is deposited by chemical vapor deposition or evaporation.

Figure 2E:
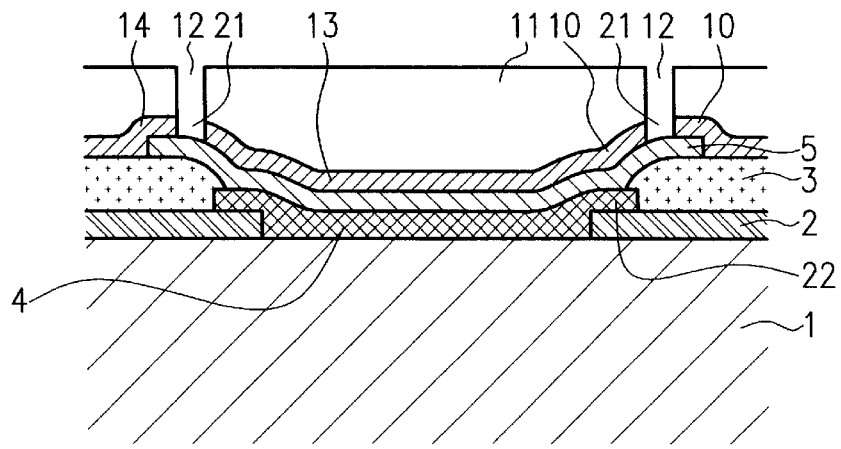
FIG. 2e depicts the structure of FIG. 2d after a layer of photoresist has been formed therein and the second metal film has been patterned to define an inner region and an outer region.

In FIG. 2e, a photoresist layer 11 is formed over the second metal film 10. The photoresist layer 11 includes an opening 12 to constitute a resist mask for forming an opening 21 in the second metal film 10. The opening 21 isolates an inner region 13 of the second metal film 10 from an outer region 14 of the second metal film 10. The inner region 13 will also be referred to as a contact area and the outer region 14 will also be referred to as a current distribution area, since the inner region 13 will substantially define an area where a solder bump material is to be deposited, whereas the outer region serves as a current distribution area during electroplating of a solder material, as will be explained later. It should be noted that, in one embodiment, the opening 21 is, at least in part, formed over the first metal film 5 so that an electrical contact between the outer region 14 and the inner region 13 is obtained when the solder material is deposited by electroplating.

Figure 2F:
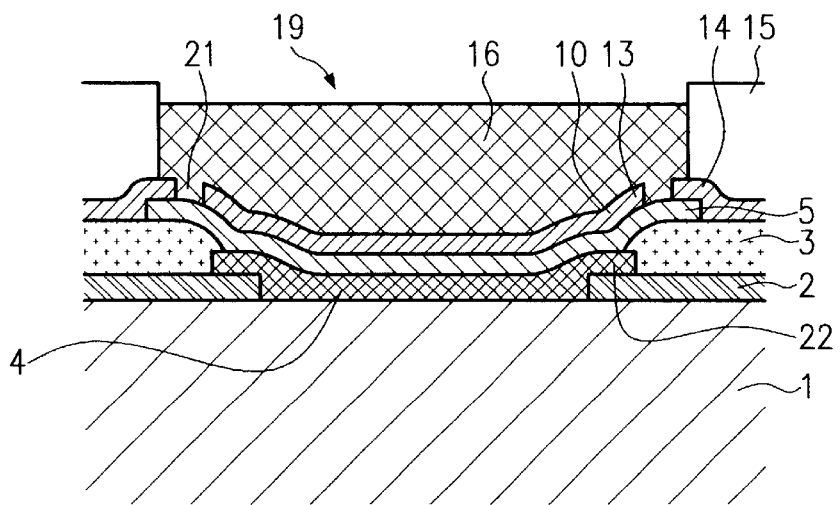
FIG. 2f depicts the structure of FIG. 2e after another photomask is formed thereabove to define an opening above the contact pad wherein the opening is filled with a solder material.

In FIG. 2f, a photoresist mask 15 is formed and defines an opening 19 formed over the contact pad 4 and having a lateral extension such that the opening 19 encloses the opening 21 of the second metal film 10. The opening 19 is filled, at least partially, with a solder material 16, such as lead/tin in an appropriate ratio, for example with a ratio in the range of approximately 60:40 to 95:5. According to one illustrative embodiment, the solder material 16 may substantially be comprised of gold to form bumps employed in the TAB bonding technique.

As previously explained, the solder material 16 may preferably be deposited by electroplating, wherein the perimeter of the substrate 1 is brought into electrical contact with an electrode of a plating bath (not shown) to provide a current to the opening 19. Although the opening 21 in the second metal film 10 isolates the inner region 13 from the outer region 14, a current flow is established by the first metal film 5 providing an electrical short between the outer region 14 and the inner region 13. Thus, the entire bottom surface of the opening 19 acts as an electron source to reduce metal ions and initiate deposition of the solder material 16 within the opening 19.

Although electroplating is the preferred deposition method for the solder material 16, in one embodiment the solder material may be deposited by other techniques known in the art, such as chemical vapor deposition, sputter deposition, and evaporation. Moreover, according to a further embodiment, the solder material 16 may not cap over or extend beyond the opening 21, as is shown in FIG. 2f, but instead the opening 21 may only be partially filled with the solder material 16 by appropriately patterning the opening 19 to exhibit a smaller lateral extension. This will facilitate the formation of solder balls by reflowing the solder material 16, as will be described herein.

Figure 2G:
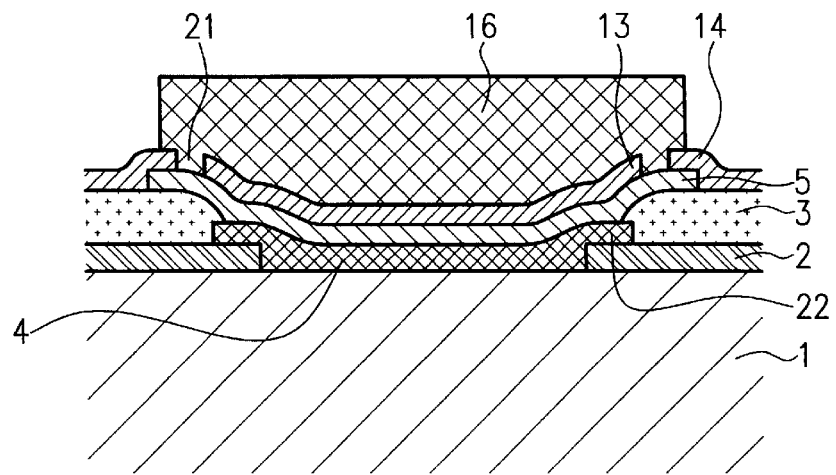
FIG. 2g depicts the structure of FIG. 2f after the photomask has been removed.

FIG. 2g shows the structure of FIG. 2f with the photoresist mask 15 removed. The solder material 16 remains in the form of a solder bump and will also be indicated by the reference numeral 16.

Figure 2H:
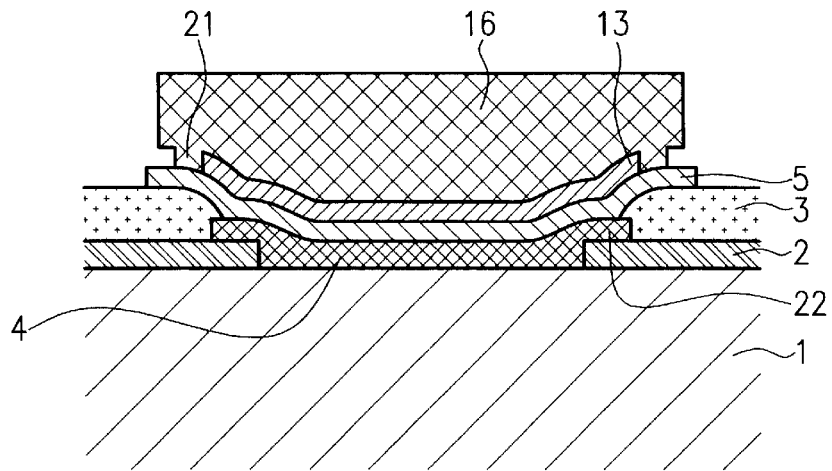
FIG. 2h depicts the structure of FIG. 2g after the outer region of the second metal film is removed.

FIG. 2h shows the structure of FIG. 2g, wherein the outer region 14 of the second metal film 10 is removed. The removal of the outer region 14 of the second metal film 10 may be accomplished by electroetching, selective wet-etching, and the like, wherein the solder bump 16 acts as an etch mask. In particular, the solder material in the opening 21 prevents the metal of the inner region 13 of the second metal film 10 from coming into contact with the etchant, so that the solder material in the opening 21 acts as an efficient etch stop.

In the case of the previously mentioned embodiments in which the first metal film 5 is not patterned into an island, the first metal film 5 may be removed by a separate etch step, wherein an underetch below the opening 21 is smaller than a lateral width of the opening 21, since a thickness of the first metal film 5 is in the range of approximately 200–800 nm and is smaller than the lateral width of the opening 21, which may typically be in the range of approximately 500–3000 nm.

Figure 2I:
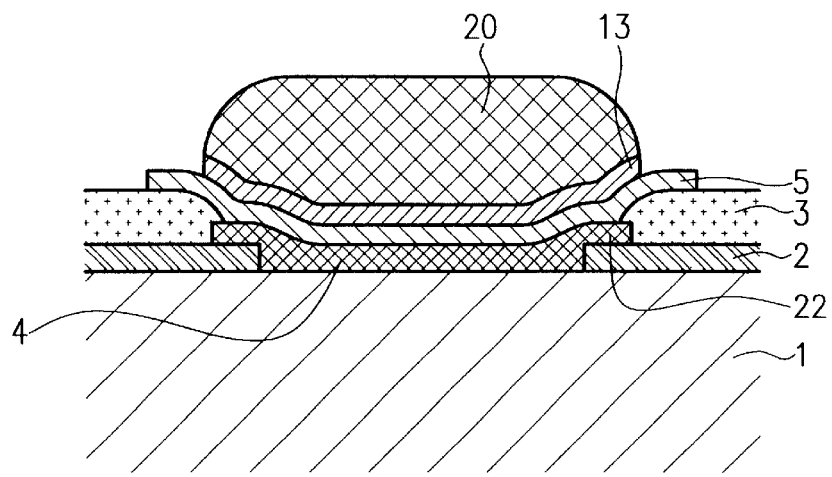
FIG. 2i depicts a solder ball formed on the inner region of the second metal film in accordance with one illustrative embodiment of the present invention.

FIG. 2i shows a solder ball 20 formed on the inner region 13 of the second metal film 10. As previously explained, typically the solder bump 19 is reflowed and, due to the surface tension of the liquid solder material 16, the solder material recedes onto the inner region 13, where the solder ball 20 is formed upon cooling of the solder material 16. Since the lateral extension of the inner region 13 is defined by photolithography without being affected by the etch step for removing the outer region 14, the lateral dimensions of the solder ball 20 are precisely defined. Thus, any underetch of the inner region 13, as in prior art processing, is effectively avoided to thereby provide a solder ball 20 the shape and structure of which is precisely defined.

It should be noted that the method and the solder bump structure in accordance with the present invention is completely compatible with conventional batch processes used in integrated circuit processing. The process steps can be carried out under normal clean room conditions without special equipment and material. The process steps necessary for practicing the present invention are low temperature and low energy processes, and hence these processes do not influence the structures already formed on and in the substrate 1.

As a result, the present invention provides a solder bump structure and a method of forming the same, wherein a part of a metal film stack may be patterned prior to the deposition of a solder material, so that the removal of the remaining metal film stack after formation of a solder bump involves a simplified etch process compared to the prior art processing. Reducing the number of required etch steps for removing the metal film stack that serves two functions, i.e., to provide a current distribution layer for electroplating the solder material and to act as a diffusion barrier and adhesion layer under the solder material, results in two advantages: a) the underetch of the solder bump is significantly reduced, i.e., the under-bump metallization exhibits a precisely defined lateral extension without being affected by etch-dependent parameters, and b) the surface of the solder bump acting as an etch mask during removal of that portion of the metal film stack which serves as the current distribution layer is much less exposed to the etchant than during the complex etch process in accordance with the prior art processing.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a solder bump, comprising:
   providing a substrate having formed thereon a contact pad and a passivation layer partially covering the contact pad;
   depositing a first metal film on the substrate;
   depositing a second metal film on the first metal film;
   patterning the second metal film to form an opening, the opening defining an inner region of the second metal film isolated from an outer region of the second metal film; and
   depositing a metal on the inner region and in said opening.

2. The method of claim 1, further comprising patterning the first metal film prior to depositing the second metal film.

3. The method of claim 2, wherein the first metal film is patterned to form an island extending beyond the inner region of the second metal film.

4. The method of claim 1, further comprising etching the second metal film using the metal deposited in said opening as an etch stop.

5. The method of claim 1, further comprising reflowing the metal deposited in said opening to form a solder ball on the inner region of the second metal film.

6. The method of claim 1, wherein the metal deposited in said opening is deposited by electroplating.

7. The method of claim 1, wherein the first metal film and the second metal film are deposited by one of sputter deposition and chemical vapor deposition.

8. The method of claim 1, wherein at least one of the first metal film and the second metal film comprises a plurality of layers.

9. The method of claim 1, wherein at least one of the first metal film and the second metal film comprises at least one of titanium/tungsten, chromium, copper, chromium/copper, copper/tin and gold.

10. The method of claim 2, wherein patterning the first metal film comprises:
    depositing a layer of photoresist material;
    patterning the layer of photoresist to cover an area above the contact pad that extends beyond the contact pad; and
    etching the first metal film.

11. The method of claim 10, wherein the outer region of the second metal film and the first metal film serves as a current distribution layer during deposition of the metal in the opening in an electroplating process.

12. The method of claim 1, wherein the metal deposited in the opening comprises at least one of lead, tin and gold.

13. The method of claim 1, further comprising reflowing the metal deposited in the opening to form a solder ball.

14. The method of claim 13, wherein the solder ball has a lateral dimension of approximately 50–120 µm.

15. A solder bump structure comprising:
   a substrate having a contact pad formed in a passivation layer;
   a first metal film formed on the contact pad;
   a second metal film formed on the first metal film, the second metal film including:
      an inner region above the contact pad,
      an opening formed in the second metal film around the contact pad, and
      an outer region isolated from the inner region by said opening; and
   a solder bump formed on the inner region of the second metal film and, at least partially, in said opening.

16. The solder bump structure of claim 15, wherein the outer region of the second metal film overlaps with the first metal film.

17. The solder bump structure of claim 15, wherein the solder bump caps over said opening.

18. The solder bump structure of claim 15, wherein the passivation layer is comprised of at least one of polyimide, silicon dioxide, silicon nitride and glass.

19. The solder bump structure of claim 15, wherein a lateral extension of the inner region of the second metal film is less than a lateral extension of the first metal film.

20. The solder bump structure of claim 15, wherein at least one of the first metal film and the second metal film is comprised of a stack of metal layers.

21. The solder bump structure of claim 15, wherein at least one of the first metal film and the second metal film comprises at least one of titanium/tungsten, chromium, copper, chromium/copper, copper/tin and gold.

22. The solder bump structure of claim 15, wherein at least one of the first metal film and the second metal film is an adhesion layer.

23. The solder bump structure of claim 15, wherein at least one of the first metal film and the second metal film is a diffusion barrier.

24. The solder bump structure of claim 15, wherein said solder bump is comprised of at least one of lead, tin and gold.

25. The solder bump structure of claim 15, wherein the solder bump has a lateral dimension of about 20–120 µm.

* * * * *